US012748145B2

(12) United States Patent
Sobolewski

(10) Patent No.: US 12,748,145 B2
(45) Date of Patent: Sep. 29, 2026

(54) LOW CURRENT LEAKAGE MEASUREMENT ON A HIGH CURRENT UNIFIED STATIC AND DYNAMIC CHARACTERIZATION PLATFORM

(71) Applicant: Keithley Instruments, LLC, Solon, OH (US)

(72) Inventor: Gregory Sobolewski, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 446 days.

(21) Appl. No.: 18/212,071

(22) Filed: Jun. 20, 2023

(65) Prior Publication Data

US 2023/0408577 A1 Dec. 21, 2023

Related U.S. Application Data

(60) Provisional application No. 63/354,202, filed on Jun. 21, 2022.

(51) Int. Cl.
*G01R 31/30* (2006.01)
*G01R 31/26* (2020.01)
(Continued)

(52) U.S. Cl.
CPC ..... *G01R 31/3008* (2013.01); *G01R 31/2621* (2013.01); *G01R 31/2642* (2013.01); *G01R 31/3277* (2013.01); *G01R 31/52* (2020.01)

(58) Field of Classification Search
CPC ............ G01R 31/3008; G01R 31/2621; G01R 31/2642; G01R 31/3277; G01R 31/52;
(Continued)

(56) References Cited

U.S. PATENT DOCUMENTS 3,206,675 A 9/1965 Frank
3,370,233 A 2/1968 James
(Continued)

FOREIGN PATENT DOCUMENTS

CN 106482829 B 8/2018
CN 109143011 A 1/2019
(Continued)

OTHER PUBLICATIONS

Awwad et al., "Static and Dynamic Characterization of GaN HEMT Power Semiconductor Devices," IOSR Journal of Electrical and Electronics Engineering (IOSR-JEEE), e-ISSN: 2278-1676, p-ISSN: 2320-3331, vol. 14, Issue 5 Ser. 1 (Sep.-Oct. 2019), pp. 73-81. Retrieved from the internet, URL: https://www.iosrjournals.org/iosr-jeee/Papers/Vol14-Issue5/Series-1/H1405017381.pdf.
(Continued)

*Primary Examiner* — Raul J Rios Russo
(74) *Attorney, Agent, or Firm* — Miller Nash LLP; Andrew J. Harrington; Krista Y. Chan

(57) ABSTRACT

A testing system includes a Device Under Test (DUT) interface structured to couple to one or more DUTs and a device characterization circuit structured to be controlled to perform static testing and dynamic testing of the one or more DUTs. The device characterization circuit includes a drain amplifier coupled to a drain of the one or more DUTs that is structured to measure drain leakage current. Methods of measuring drain current in a device that performs both static and dynamic testing are also described.

20 Claims, 3 Drawing Sheets

(51) Int. Cl.
*G01R 31/327* (2006.01)
*G01R 31/52* (2020.01)

(58) Field of Classification Search
CPC ................ G01R 31/26; G01R 31/2648; G01R 31/2831; G01R 31/31702
USPC ...................................................... 324/762.01
See application file for complete search history.

(56) References Cited

U.S. PATENT DOCUMENTS

| | | | | | |
|---|---|---|---|---|---|
| 3,636,450 | A | 1/1972 | Griffin | | |
| 7,000,204 | B2 | 2/2006 | McGuffin et al. | | |
| 7,148,674 | B2 | 12/2006 | Choi et al. | | |
| 7,224,160 | B1 | 5/2007 | Pronin | | |
| 7,280,929 | B1 | 10/2007 | Zhao | | |
| 7,342,401 | B2 | 3/2008 | Knauer | | |
| 7,550,987 | B2 | 6/2009 | Acharyya et al. | | |
| 7,724,017 | B2 | 5/2010 | Zhao | | |
| 9,159,452 | B2 | 10/2015 | Yamada | | |
| 9,368,416 | B2 | 6/2016 | Singh et al. | | |
| 9,553,559 | B2 | 1/2017 | Sobolewski | | |
| 9,625,517 | B2 | 4/2017 | Zhu et al. | | |
| 9,632,126 | B2 | 4/2017 | Yoon et al. | | |
| 9,970,980 | B2 | 5/2018 | Bodano | | |
| 10,360,330 | B2 | 7/2019 | Kawa et al. | | |
| 10,436,827 | B2 | 10/2019 | Diegmann et al. | | |
| 10,641,811 | B2 | 5/2020 | Kim et al. | | |
| 10,878,155 | B2 | 12/2020 | Kim et al. | | |
| 11,125,814 | B2 | 9/2021 | Hamada et al. | | |
| 11,215,664 | B1 | 1/2022 | Yun et al. | | |
| 11,460,502 | B2 | 10/2022 | Kim et al. | | |
| 2006/0139047 | A1* | 6/2006 | Zhou | G01R 31/2884 | 324/750.3 |
| 2006/0282804 | A1* | 12/2006 | Ang | G01R 31/2628 | 257/48 |
| 2008/0204064 | A1* | 8/2008 | Zhang | G11C 29/48 | 324/764.01 |
| 2009/0160463 | A1* | 6/2009 | Agarwal | G01R 31/2884 | 324/686 |
| 2009/0251167 | A1* | 10/2009 | Agarwal | G01R 31/2621 | 324/762.09 |
| 2012/0256651 | A1* | 10/2012 | Bhushan | G01R 31/2884 | 324/537 |
| 2015/0185277 | A1* | 7/2015 | Montrose | G01R 31/31924 | 702/118 |
| 2016/0069950 | A1* | 3/2016 | Chen | G01R 31/2868 | 324/750.05 |
| 2018/0188313 | A1* | 7/2018 | Paikin | G01R 31/2849 | |
| 2019/0011493 | A1* | 1/2019 | Paikin | G01R 31/2642 | |
| 2019/0369167 | A1* | 12/2019 | Bhat | G01R 31/40 | |
| 2023/0135676 | A1* | 5/2023 | Kim | G06F 3/0412 | 345/173 |

FOREIGN PATENT DOCUMENTS

| | | | |
|---|---|---|---|
| CN | 108318727 | B | 11/2020 |
| CN | 108051719 | B | 12/2020 |
| CN | 212410779 | U | 1/2021 |
| CN | 113176484 | A | 7/2021 |
| CN | 111693839 | B | 9/2021 |
| CN | 110531136 | B | 11/2021 |
| CN | 215728641 | U | 2/2022 |
| CN | 110954842 | B | 4/2022 |
| CN | 115308564 | A | 11/2022 |
| JP | 5817361 | B2 | 11/2015 |

OTHER PUBLICATIONS

Low Level Measurements Handbook—7th Edition: Precision DC Current, Voltage, and Resistance Measurement, Keithley, A Tektronix Company, Feb. 2016. Retrieved from the internet, URL: https://download.tek.com/document/LowLevelHandbook_7thEd.pdf.

Méjean, "Static and Dynamic Characterization of power semiconductors," (Dissertation), Stockholm, Sweden, 2019. Retrieved from the internet, URL: http://www.diva-portal.org/smash/get/diva2:1421292/FULLTEXT01.pdf.

Model 8010 High Power Device Text Fixture User's Manual, 8010-900-01 Rev. C, Keithley Instruments, Mar. 2017. Retrieved from the internet, URL: http://www.finaltest.com.mx/v/vspfiles/assets/datasheet/8010DT.pdf.

Rossi, "Toward a unified framework for static and dynamic measurements," 2015 IEEE International Instrumentation and Measurement Technology Conference (12MTC) Proceedings, Pisa, Italy, 2015, pp. 1516-1521, doi: 10.1109/I2MTC.2015.7151503.

Techniques for Proper and Efficient Characterization, Validation, and Reliability Testing of Power Semiconductor Devices. Application Guide. Tektronix, Jan. 2016. Retrieved from the internet, URL: http://download.tek.com/document/1KA-17996-1_Power%20Applications%20Guide.pdf.

* cited by examiner

LOW CURRENT LEAKAGE MEASUREMENT ON A HIGH CURRENT UNIFIED STATIC AND DYNAMIC CHARACTERIZATION PLATFORM

CROSS-REFERENCE TO RELATED APPLICATIONS

This disclosure claims benefit of U.S. Provisional Application No. 63/354,202, titled "LOW CURRENT LEAKAGE MEASUREMENT ON A HIGH CURRENT UNIFIED STATIC AND DYNAMIC CHARACTERIZATION PLATFORM," filed on Jun. 21, 2022, the disclosure of which is incorporated herein by reference in its entirety.

TECHNICAL FIELD

This disclosure relates to test and measurement systems and instruments, and more particularly to a unified measurement system for performing both static and dynamic characterization of a device under test.

BACKGROUND

Characterization of a device under test (DUT), for example semiconductor devices such as a silicon-carbide (SiC) metal-oxide-semiconductor field-effect transistor (MOSFET), or other devices, may generally include both static characterization, such as current/voltage (I/V) curves, and dynamic characterization, such as switching parameters.

DUT parameters such as drain and gate leakage measurements yield important information about MOSFET device characterization, but are presently available only on static test platforms, which are not available in all testing environments, due to their size and expense.

Embodiments of the disclosed apparatus and methods address shortcomings in the prior art.

DESCRIPTION

Embodiments of the disclosure generally include circuits and methods for performing leakage measurements of a DUT in a combined, unified static and dynamic characterization measurement system or platform. Such a platform is described in U.S. patent application Ser. No. 17/688,733, titled "UNIFIED MEASUREMENT SYSTEM FOR STATIC AND DYNAMIC CHARACTERIZATION OF A DEVICE UNDER TEST," filed Mar. 7, 2022, which is incorporated by reference into this disclosure.

The embodiments here provide a combined characterization system that has two components, an interactive test and measurement device such as an oscilloscope, impedance analyzer, combination of both, or one or more of many other test and measurement devices. For simplicity, this discussion will refer to this component as a test and measurement device. The other component is a power delivery and measurement front end with a DUT interface for mounting DUTs and/or test boards for DUTs, which this discussion may also refer to as the fixture. The embodiments here generally involve two separate components, but they could also be mounted into one housing.

Figure 1:
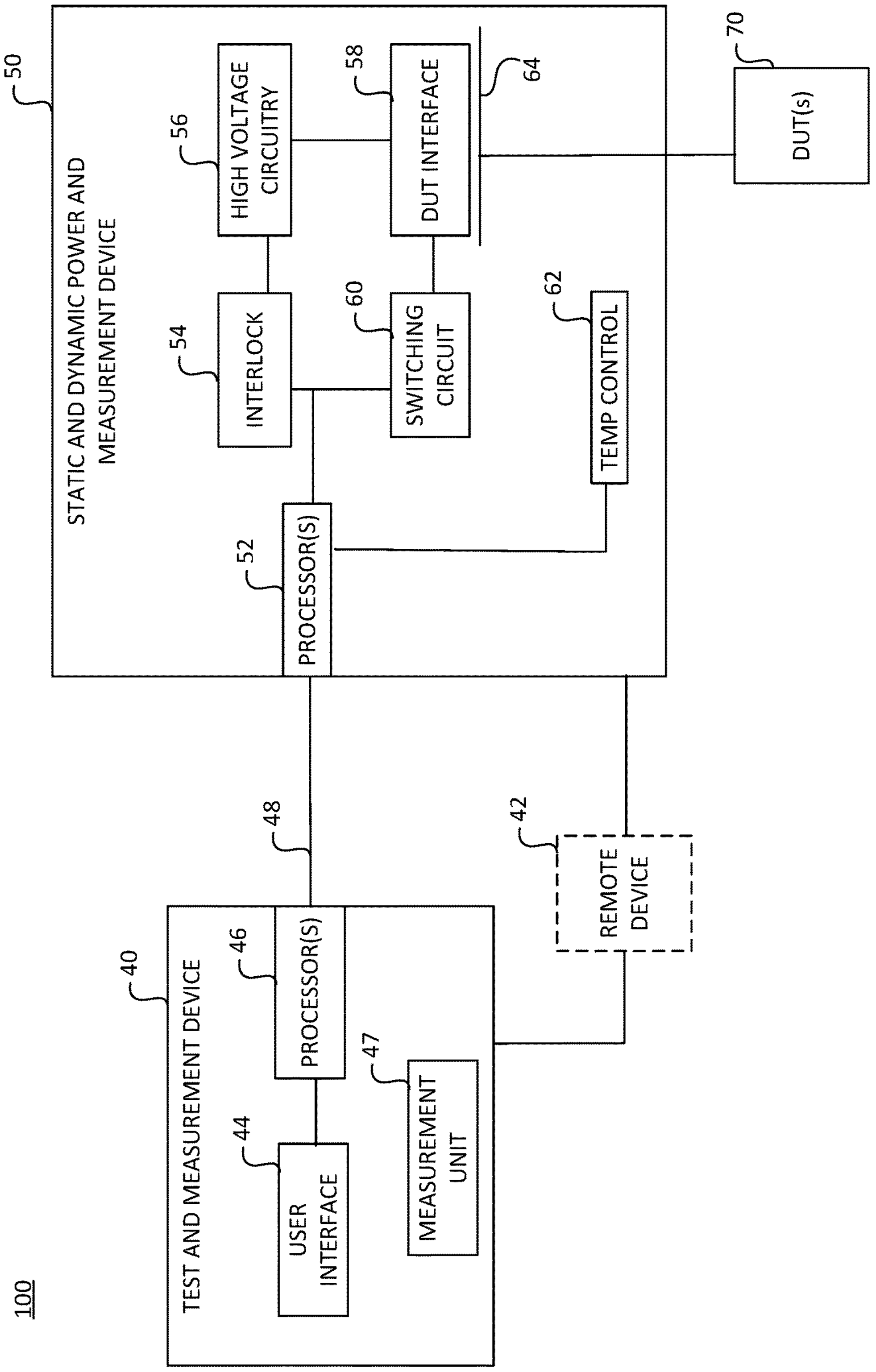
FIG. 1 is a block diagram of a DUT testing environment including a unified, static and dynamic measurement for performing low current leakage measurements according to embodiments of the disclosure.

FIG. 1 is a block diagram illustrating a test and measurement system 100, which may also be referred to as a platform, having a test and measurement device 40 such as an oscilloscope or other test and measurement device. For ease of discussion, the device 40 may be referred to as a measurement device. Another other part of the system 100 is a static and dynamic power and measurement device 50, which will be referred to as a power device for ease of discussion. These terms are not intended to limit the capabilities of either device, so no such limitation should be implied.

The measurement device 40 may have many different components, including a user interface 44 that allows a user to interact with various menus on the measurement device. The user interface 44 allows the user to make selections as to the tests to be run, set parameters, etc., such as through a display having a touch screen or various buttons and knobs. The measurement device 40 has one or more processors 46 that receive the user inputs and send the parameters and other selections to the measurement device and may receive output from the power device and generate outputs for the user from the data. The measurement device 40 includes a measurement unit 47 that performs tests and measures parameters of the DUT.

A remote device 42, such as a computing device or smart phone, may also access the test and measurement platform 100 for remote operation, either through the measurement device 40 or the power device 50. The term "processor" as used here means any electronic component or components that can receive an instruction and perform an action, such as one or more microcontrollers, field programmable gate arrays (FPGA), and/or application-specific integrated circuits (ASIC), as will be discussed in more detail further.

The measurement device 40 communicates with the power device 50 through a cable or other direct connection 48. The two devices and their cable are configured to be portable, and transportable by one individual. The cable connects to each device through connection circuitry that allows the devices to switch configurations without having to re-cable.

The power device 50 may also have several different elements. These may include one or more processors 52, high voltage circuitry 56 that provides high voltage to the device under test (DUT), and an interlock 54 that acts as a protection for the high voltage circuitry. The interlock is designed to prevent device damage or any dangerous conditions resulting from the high voltage produced by the high voltage circuitry. A DUT interface 58 couples to an externally mounted DUT 70. The DUT 70 may actually include more than one separate device, depending on the testing configuration. The DUT interface 58 may be embodied by a universal DUT interface that allows the DUT 70 to connect to the various components in the power device 50. The power device 50 may also include a barrier 64 to protect the device 50 from the DUT 70.

High voltage circuitry within the power device 50 as well as the operation of the DUTs 70 may generate heat, and/or the DUTs may need a particular temperature range to operate. The power device 50 may include temperature control circuitry 62 to control the temperature of the DUT 70. The one or more processors 52 monitor the temperature and operate the temperature control 62 which may comprise items such as fans, switchable heat sinks, cooling systems, heaters, etc. The power device 50 may also include a switching circuit 60, which controls operation of various components within the power device to test and measure the DUTs 70.

Generally, in operation, a user makes an input through the user interface 44, remotely or directly, to control operation of the power device 50 to characterize the DUT 70. Typically, dynamic characterization is performed using a half bridge circuit such as the embodiment shown in FIG. 2. One method of performing dynamic characterization, referred to here as the double pulse method, uses this type or circuit.

Figure 2:
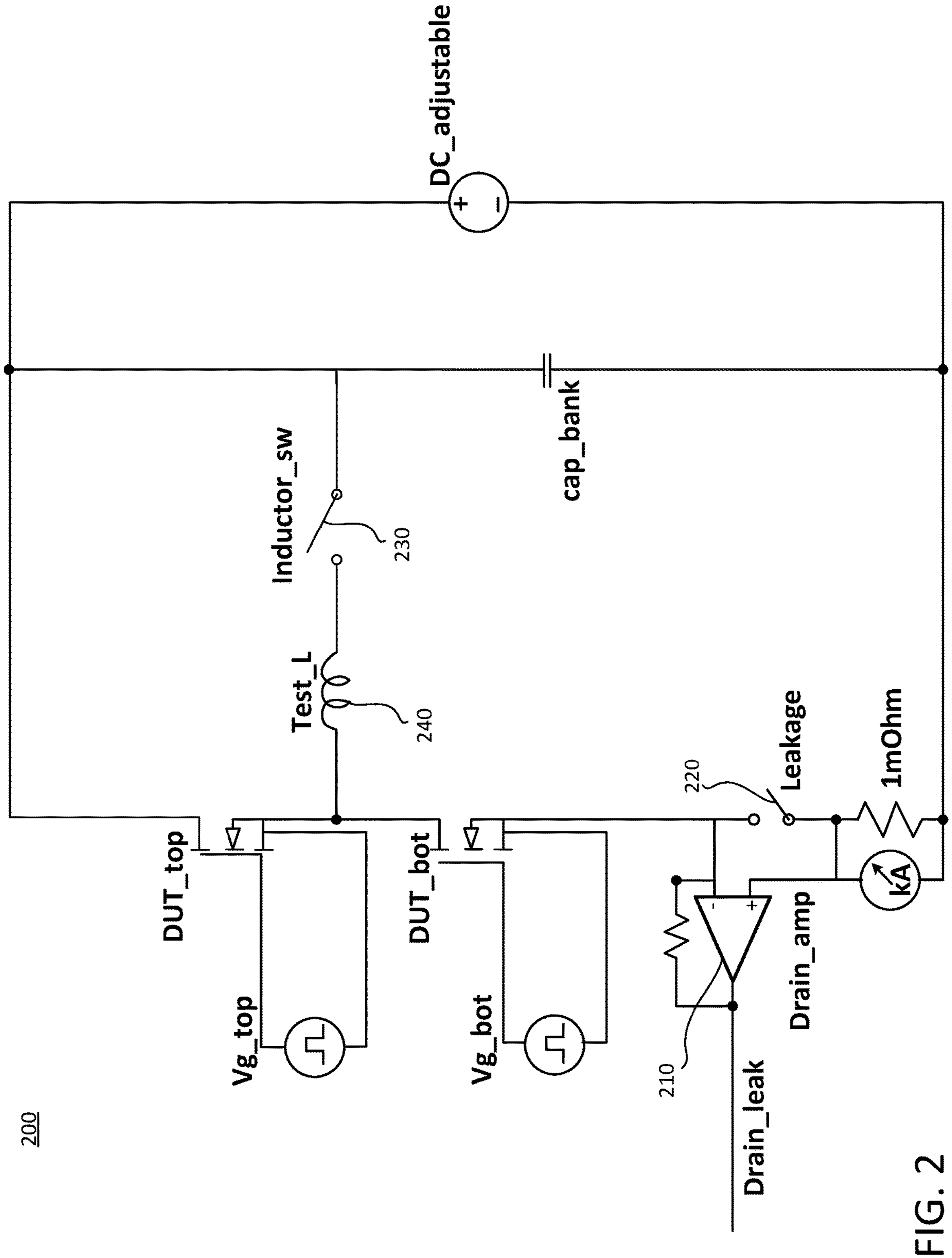
FIG. 2 is a schematic diagram of an example circuit for characterizing drain leakage current in one or more DUTs in conjunction with the testing environment of FIG. 1, according to embodiments of the disclosure.

In general, the characterization circuit 200 of FIG. 2 is housed within the power device 50, and more specifically within the switching circuit 60, although embodiments of the disclosure are not limited to such an example. The characterization circuit 200 illustrates two DUTs, DUT_top and DUT_bot, which are illustrated as DUT(s) 70 in FIG. 1.

In general operation, a bottom device, DUT_bot, is turned on to obtain desired current through the Test_L inductor. Subsequently, the bottom device, DUT_bot, is turned off and the top device, DUT_top, is turned on. This circulates the inductor current from a Test_L inductor. Alternatively, the top device may be replaced by a diode, if only one DUT 70 is being tested. After a specified time that depends upon the circuit characteristics, the top device is turned off, and the bottom device is turned on. The desired data may be collected during both device transitions and energy losses are calculated. This same platform, depending upon the control of voltages and currents through the devices, can be used to extract static parameters.

Replacing the top DUT with a diode or a short allows gate control of the bottom device that in turn allows extraction of static current-voltage (I/V) curves. With the top DUT available, additional methods of extracting static data can be used. These may include independent gate/drain pulsing of potentials at the bottom DUT. To do so, the system would control the voltage at the gate of the bottom DUT to allow proper transfer characteristics measurements of the device. Static I/V device characterizations do not need the inductor Test_L, but its presence allows the same circuit to perform both static and dynamic characterizations. If both top and bottom DUTs exist in the circuit and are the same types of devices, the maximum power configuration would be split between the two devices. If a full power test of one of the devices is desired, the other device would be replaced with a short.

The characterization circuit 200 includes a drain amplifier 210, which is used to measure drain leakage currents of the DUT_top and DUT_bot, on the order of nAmps. In some embodiments the drain amplifier 210 includes auto-ranging capability so as to accurately measure different orders of magnitude of current leakage through the same amplifier. A leakage switch 220 is controlled to bypass or enable the function of the drain amplifier 210. In practice, the leakage switch 220 may be physically large to withstand high currents of the testing environment. When the leakage switch 220 is in the closed position, the characterization circuit 200 is able to provide DUT test currents up to kAmp levels. When the leakage switch 220 is in the open position, it is effectively guarded by the drain amplifier 210, which facilitates measuring very low currents from the DUTs. Although it may appear in FIG. 2 that the drain amplifier 210 is coupled only to the sources of DUT_top or DUT_bot, in practice the drain amplifier 210 measures both source and gate currents of DUT_top or DUT_bot, which equals the drain current.

An inductor switch 230 effectively controls whether a test inductor 240 is active in the characterization circuit 200. When the characterization circuit 200 is set up to measure drain leakage current, i.e., when the leakage switch 220 is open, the inductor switch 230 controls which DUT, DUT_top or DUT_bot, is being measured. When the inductor switch 230 is closed, drain leakage current from only DUT_bot can be measured. If the inductor 240 is effectively removed from the testing circuit by opening inductor switch 230, then leakage currents from both DUT_top and DUT_bot leakage can be measured by the drain amplifier 210, depending on the gate drive configuration of a given MOSFET DUT. More specifically, if Vg top is set to provide a voltage to fully turn on DUT_top, the drain leakage current of DUT_bot can be characterized. Conversely, when Vg bot is set to provide a voltage to fully turn on DUT_bot, the drain leakage current of the DUT_top can be characterized.

Previous drain leakage characterizations were performed on static test benches, and not dynamic test benches as illustrated in FIG. 2. Further, drain leakage characterizations were previously measured on the output of a high voltage source, which required a complex instrument that characterizes only a single DUT at a time. Not only does the characterization circuit 200 use a highly accurate drain amplifier 210 to measure extremely small leakage currents, the characterization circuit 200 is a dynamic test bench, and also allows testing of two DUTs simultaneously. Further, the characterization circuit 200 enables drain leakage current measurements independent of the drain voltage source.

Figure 3:
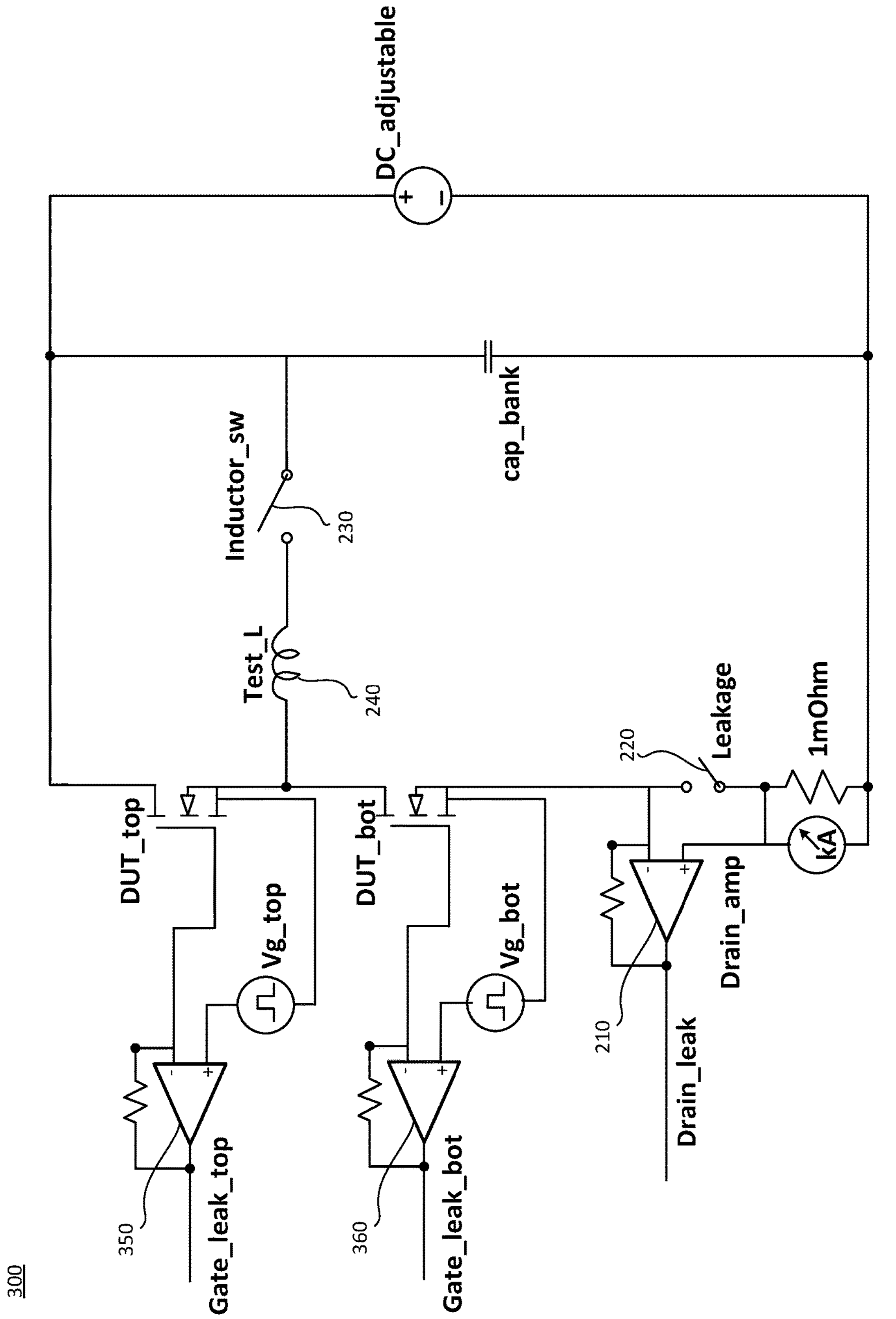
FIG. 3 is a schematic diagram of an example circuit for characterizing gate leakage current in one or more DUTs in conjunction with the testing environment of FIG. 1, according to embodiments of the disclosure.

FIG. 3 illustrates a characterization circuit 300 used to measure gate leakage current from the DUTs. The characterization circuit 300 includes many of the same components as the characterization circuit 200 described with reference to FIG. 2, the functions of which are not repeated here for brevity.

The characterization circuit 300 includes two amplifiers, top gate amplifier 350 and bottom gate amplifier 360, which are floating gate current measurement amplifiers. Including top gate amplifier 350 and bottom gate amplifier 360 enables characterization of leakage current on both top and bottom devices DUT_top and DUT_bot.

In operation, DUT_top may be characterized at different drain voltages when the inductor switch 230 is open, removing the effect of the inductor 240. Typical gate leakage is measured, however, with Vds=0V, which can be obtained even when the inductor switch is closed and the inductor 240 is in place.

In general, operation of the leakage switch 220, inductor switch 230, as well as the currents and voltages applied to the DUTs are automatically controlled by operation of the power device 50, which are pre-programmed to perform device characterization on the various DUTs 70 being tested in the test and measurement system 100 (FIG. 1). In normal operation, the user attaches the one or more DUTs 70 to a test fixture, and controls the user interface 44 of the measurement device 40 to run the device characterizations of the device. Particular measurements and parameters are captured by the measurement device 40 as the power device 50 proceeds through its various pre-programmed device characterization tests.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the disclosed technologies are provided below. An embodiment of the technologies may include one or more, and any combination of, the examples described below.

Example 1 is a testing system, including a Device Under Test (DUT) interface structured to couple to one or more DUTs and a device characterization circuit structured to be controlled to perform static testing and dynamic testing of the one or more DUTs, including a drain amplifier coupled to a drain of the one or more DUTs and structured to measure drain leakage current.

Example 2 is a testing system according to Example 1, in which the device characterization circuit further comprises a bypass switch, the operation of which enables or disables the drain amplifier to measure drain leakage current.

Example 3 is a testing system according to any of the previous Examples, in which the drain amplifier is coupled between the drain of the one or more DUTs and a ground reference.

Example 4 is a testing system according to any of the previous Examples, in which the one or more DUTs includes a first MOSFET device and a second MOSFET device, and in which the characterization circuit further comprises an inductor coupled between the first and second MOSFET devices, and a switch in series with the inductor and structured to controllably enable an effect of the inductor in the device characterization circuit.

Example 5 is a testing system according to any of the previous Examples, in which the device characterization circuit further comprises a gate amplifier coupled to a gate of the one or more DUTs and structured to measure a gate leakage current.

Example 6 is a testing system according to Example 5, in which the device characterization circuit further comprises a second gate amplifier coupled to a second gate of the one or more DUTs and structured to measure a second gate leakage current.

Example 7 is a testing system according to any of the preceding Examples, in which the device characterization circuit further comprises a gate voltage driver structured to control a gate voltage of the one or more DUTs.

Example 8 is a test and measurement system, including a measurement device, and a power device, including an interface to allow connection to one or more devices under test (DUTs), a switching circuit structured to control an operation of the power device to perform both static testing and dynamic testing of the one or more DUTs, and a device characterization circuit under the control of the switching circuit, the device characterization circuit including a drain amplifier coupled to a drain of the one or more DUTs and structured to measure drain leakage current.

Example 9 is a test and measurement system according to Example 8, in which the device characterization circuit further comprises a bypass switch, the operation of which enables or disables the drain amplifier to measure drain leakage current.

Example 10 is a test and measurement system according to any of the previous Examples 8-9, in which the drain amplifier is coupled between the drain of the one or more DUTs and a ground reference.

Example 11 is a test and measurement system according to any of the previous Examples 8-10, in which the one or more DUTs includes a first MOSFET device and a second MOSFET device, and in which the characterization circuit further comprises an inductor coupled between the first and second MOSFET devices, and a switch in series with the inductor and structured to controllably enable an effect of the inductor in the device characterization circuit.

Example 12 is a test and measurement system according to any of the previous Examples 8-11, in which the device characterization circuit further comprises a gate amplifier coupled to a gate of the one or more DUTs and structured to measure a gate leakage current.

Example 13 is a test and measurement system according to Example 12, in which the device characterization circuit further comprises a second gate amplifier coupled to a second gate of the one or more DUTs and structured to measure a second gate leakage current.

Example 14 is a test and measurement system according to Example 12, in which the device characterization circuit further comprises a gate voltage driver structured to control a gate voltage of the one or more DUTs.

Example 15 is a method in a test environment, including accepting an input from a user to perform static or dynamic testing on one or more DUTs in the test environment using a same characterization circuit for both tests and measuring drain leakage current from the one or more DUTs through a drain amplifier coupled between the one or more DUTs and a ground reference voltage.

Example 16 is a method according to Example 15, further comprising disabling the drain amplifier by coupling inputs to the drain amplifier to one another through a controllable switch.

Example 17 is a method according to any of the preceding Example methods, in which the one or more DUTs comprises a MOSFET device, the method further comprising measuring a gate leakage current of the MOSFET device through a gate amplifier in the characterization circuit.

Example 18 is a method according to any of the preceding Example methods, in which the one or more DUTs comprises a first MOSFET device and a second MOSFET device, the method further comprising measuring a gate leakage current of the first MOSFET device through a first gate amplifier in the characterization circuit and measuring a gate leakage current of the second MOSFET device through a second gate amplifier in the characterization circuit.

Example 19 is a method according to example 18, further comprising controlling a gate voltage of the first MOSFET device and a second MOSFET device to isolate one of the MOSFET devices.

Example 20 is a method according to any of the preceding Examples 18-19, further comprising controlling an effect of an inductor coupled between the first MOSFET device and the second MOSFET device in the characterization circuit.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A testing system, comprising:
- a Device Under Test (DUT) interface structured to couple to one or more DUTs; and
- a device characterization circuit structured to be controlled to perform static testing and dynamic testing of the one or more DUTs, including:
  - a drain amplifier coupled to a drain of the one or more DUTs and structured to measure drain leakage current, wherein a feedback resistor is coupled between an output of the drain amplifier and an input of the drain amplifier; and
  - a bypass switch, wherein operation of which enables or disables the drain amplifier to measure drain leakage current.

2. The testing system according to claim 1, in which the drain amplifier is coupled between the drain of the one or more DUTs and a ground reference.

3. The testing system according to claim 1, in which the one or more DUTs includes a first MOSFET device and a second MOSFET device, and in which the device characterization circuit further comprises:
- an inductor coupled between the first and second MOSFET devices; and
  - a switch in series with the inductor and structured to controllably enable an effect of the inductor in the device characterization circuit.

4. The testing system according to claim 1, in which the device characterization circuit further comprises a gate amplifier coupled to a gate of the one or more DUTs and structured to measure a gate leakage current.

5. The testing system according to claim 4, in which the device characterization circuit further comprises a second gate amplifier coupled to a second gate of the one or more DUTs and structured to measure a second gate leakage current.

6. The testing system according to claim 4, in which the device characterization circuit further comprises a gate voltage driver structured to control a gate voltage of the one or more DUTs.

7. The testing system according to claim 1, wherein the bypass switch comprises a controllable switch coupled to the drain amplifier and configured to disable the drain amplifier by coupling inputs of the drain amplifier to one another.

8. The testing system according to claim 7, wherein the controllable switch is configured to couple the inputs of the drain amplifier to one another during dynamic testing of the one or more DUTs, and to decouple the inputs of the drain amplifier from one another during measurement of the drain leakage current.

9. A test and measurement system, comprising:
- a measurement device; and
- a power device, including:
  - an interface to allow connection to one or more devices under test (DUTs),
  - a switching circuit structured to control an operation of the power device to perform both static testing and dynamic testing of the one or more DUTs, and
  - a device characterization circuit under the control of the switching circuit, the device characterization circuit including:
    - a drain amplifier coupled to a drain of the one or more DUTs and structured to measure drain leakage current, wherein a feedback resistor is coupled between an output of the drain amplifier and an input of the drain amplifier; and
    - a bypass switch, the operation of which enables or disables the drain amplifier to measure drain leakage current.

10. The test and measurement system according to claim 9, in which the drain amplifier is coupled between the drain of the one or more DUTs and a ground reference.

11. The test and measurement system according to claim 9, in which the one or more DUTs includes a first MOSFET device and a second MOSFET device, and in which the device characterization circuit further comprises:

an inductor coupled between the first and second MOSFET devices; and a switch in series with the inductor and structured to controllably enable an effect of the inductor in the device characterization circuit.

12. The test and measurement system according to claim 9, in which the device characterization circuit further comprises a gate amplifier coupled to a gate of the one or more DUTs and structured to measure a gate leakage current.

13. The test and measurement system according to claim 12, in which the device characterization circuit further comprises a second gate amplifier coupled to a second gate of the one or more DUTs and structured to measure a second gate leakage current.

14. The test and measurement system according to claim 12, in which the device characterization circuit further comprises a gate voltage driver structured to control a gate voltage of the one or more DUTs.

15. A method in a test environment, comprising:

accepting an input from a user to perform static or dynamic testing on one or more DUTs in the test environment using a same characterization circuit for both tests;

selectively enabling or disabling a drain amplifier using a bypass switch; and measuring drain leakage current from the one or more DUTs through the drain amplifier coupled between the one or more DUTs and a ground reference voltage when the drain amplifier is enabled, wherein a feedback resistor is coupled between an output of the drain amplifier and an input of the drain amplifier.

16. The method of claim 15, wherein selectively enabling or disabling the drain amplifier using the bypass switch comprises disabling the drain amplifier by coupling inputs to the drain amplifier to one another through a controllable switch.

17. The method of claim 15, in which the one or more DUTs comprises a MOSFET device, the method further comprising measuring a gate leakage current of the MOSFET device through a gate amplifier in the characterization circuit.

18. The method of claim 15, in which the one or more DUTs comprises a first MOSFET device and a second MOSFET device, the method further comprising measuring a gate leakage current of the first MOSFET device through a first gate amplifier in the characterization circuit and measuring a gate leakage current of the second MOSFET device through a second gate amplifier in the characterization circuit.

19. The method of claim 18, further comprising controlling a gate voltage of the first MOSFET device and a second MOSFET device to isolate one of the MOSFET devices.

20. The method of claim 18, further comprising controlling an effect of an inductor coupled between the first MOSFET device and the second MOSFET device in the characterization circuit.

* * * * *